(12) United States Patent
Dai et al.

(10) Patent No.: US 8,563,875 B2
(45) Date of Patent: Oct. 22, 2013

(54) ELECTROMAGNETIC SHIELDING LAYER AND METHOD FOR MAKING THE SAME

(75) Inventors: Feng-Yuen Dai, Taipei (TW); Chi-Chuang Ho, Taipei (TW); Ji-Hong Pan, Shenzhen (CN); Yong Zheng, Shenzhen (CN); Kai-Li Jiang, Beijing (CN); Liang Liu, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 548 days.

(21) Appl. No.: 12/284,919

(22) Filed: Sep. 25, 2008

(65) Prior Publication Data

US 2009/0159328 A1  Jun. 25, 2009

(30) Foreign Application Priority Data

Dec. 21, 2007 (CN) .......................... 2007 1 0125405

(51) Int. Cl.
*H05K 9/00* (2006.01)

(52) U.S. Cl.
USPC ........................... 174/390; 977/789; 977/742

(58) Field of Classification Search
USPC .................. 174/350, 377, 390; 361/816, 818; 428/293.7; 977/789, 742
See application file for complete search history.

(56) References Cited

U.S. PATENT DOCUMENTS 7,301,109 B2 * 11/2007 Chen .............................. 174/350
8,211,267 B2 * 7/2012 Lin et al. ....................... 156/296
2004/0047038 A1 * 3/2004 Jiang et al. .................... 359/486
2004/0256131 A1 * 12/2004 Wang et al. ............... 174/35 MS
2005/0116336 A1 * 6/2005 Chopra et al. ................. 257/720
2008/0145616 A1 * 6/2008 Gharib et al. ................. 428/156

FOREIGN PATENT DOCUMENTS

| CN | 1738522 A | 2/2006 |
| JP | 2004-253796 A | 9/2004 |
| TW | I269632 | 12/2006 |

OTHER PUBLICATIONS

Wang et al., Ni—Cu Planted CNTs and the Properties of Anti-Electromagnetic Wave, Acta Materiae Compositae Sinica, 2005,12, vol. 22, No. 6, p. 54-58.

* cited by examiner

*Primary Examiner* — Hung Ngo (74) *Attorney, Agent, or Firm* — Altis & Wispro Law Group, Inc.

(57) ABSTRACT

An electromagnetic shielding layer comprising at least one conductive layer and a carbon nanotube film structure, the conductive layer being disposed on the carbon nanotube film structure, and comes in contact with the carbon nanotube film structure electrically. A method for making the electromagnetic shielding layer includes the steps of: (a) providing an electronic element, the electronic element having a surface; (b) fabricating at least one carbon nanotube film; (c) forming a carbon nanotube film structure on the surface of the electronic element; and (d) forming a conductive layer on the carbon nanotube film structure, then obtaining an electromagnetic shielding layer on the surface of the electronic element.

9 Claims, 9 Drawing Sheets

ELECTROMAGNETIC SHIELDING LAYER AND METHOD FOR MAKING THE SAME

BACKGROUND

1. Field of the Invention

The present invention relates to an electromagnetic shielding layer and method for making the same and, particularly, to a carbon nanotube based electromagnetic shielding layer and method for making the same.

2. Discussion of Related Art

Carbon nanotubes (CNTs) are a novel carbonaceous material and received a great deal of interest since the early 1990s. CNTs are electrically conductive, chemically stable, and individually capable of having a very small diameter (much less than 100 nanometers) and a large aspect ratio (length/diameter). Due to these properties, along with others, it has been suggested that CNTs can play an important role in various fields, such as microscopic electronics, field emission devices, thermal interface materials, etc.

With recent developments in the electronics industry, various compact devices are increasingly prone to electromagnetic interference. To improve the security and performance of these devices, many electronic accessories in the compact device, along with its shell, should maintain a good connection with the ground. The shell of the device is usually made of plastic and contains a conductive coating, which is usually formed on the surface of the plastic material to shield the device from electromagnetic interference. The electromagnetic shielding layer is produced either by spraying or painting the conductive coating to the surface of the plastic material. The conductive material can be polymer, metal powder, graphite, and metal oxide, among others. However, the conductive coating is typically too thin to effectively shield the device from electromagnetic interference. The conductive coating must be thicker to properly shield the device from unwanted interference. One drawback, however, is that the cost of the conductive coating used to produce the electromagnetic shielding layer is high. Furthermore, if the conductive coating is too thick, the electrical conductivity thereof won't be as steady.

What is needed, therefore, is to provide an electromagnetic shielding layer with good electrical conductivity and a method for making the same.

BRIEF DESCRIPTION OF THE DRAWINGS

Many aspects of the present electromagnetic shielding layer and method for making the same can be better understood with reference to the following drawings. The components in the drawings are not necessarily drawn to scale, the emphasis instead being placed upon clearly illustrating the principles of the present electromagnetic shielding layer and method for making the same.

Corresponding reference characters indicate corresponding parts throughout the several views. The exemplifications set out herein illustrate at least one embodiment of the electromagnetic shielding layer and method for making the same, in at least one form, and such exemplifications are not to be construed as limiting the scope of the invention in any manner.

DETAILED DESCRIPTION OF EXEMPLARY EMBODIMENTS

References will now be made to the drawings to describe, in detail, embodiments of the electromagnetic shielding layer and method for making the same.

Figure 1:
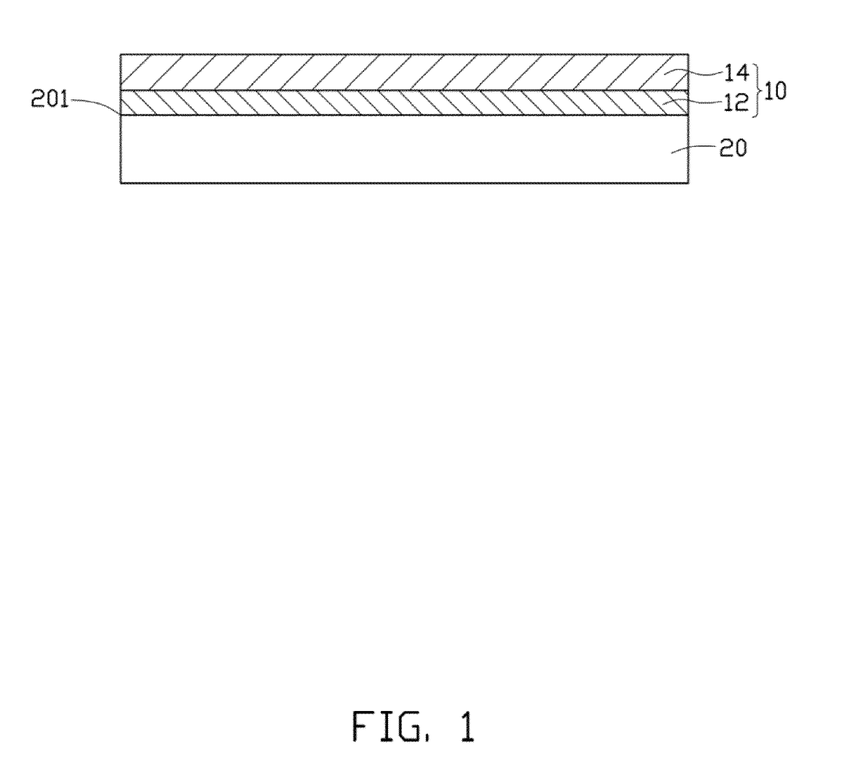
FIG. 1 is a schematic view of an electromagnetic shielding layer, in accordance with an exemplary embodiment.

Referring to FIG. 1, an electromagnetic shielding layer 10, according to an exemplary embodiment, includes a first conductive layer 14 and a carbon nanotube film structure 12. The first conductive layer 14 is disposed on the carbon nanotube film structure 12, and comes in contact with the carbon nanotube film structure 12 electrically. An electronic element 20 has a surface 201, the electromagnetic shielding layer 10 is located on the electronic element 20 with the carbon nanotube film structure 12 attached to the surface 201. The electromagnetic shielding layer 10 is used to shield the electronic element 20 from electromagnetic waves.

Figure 2:
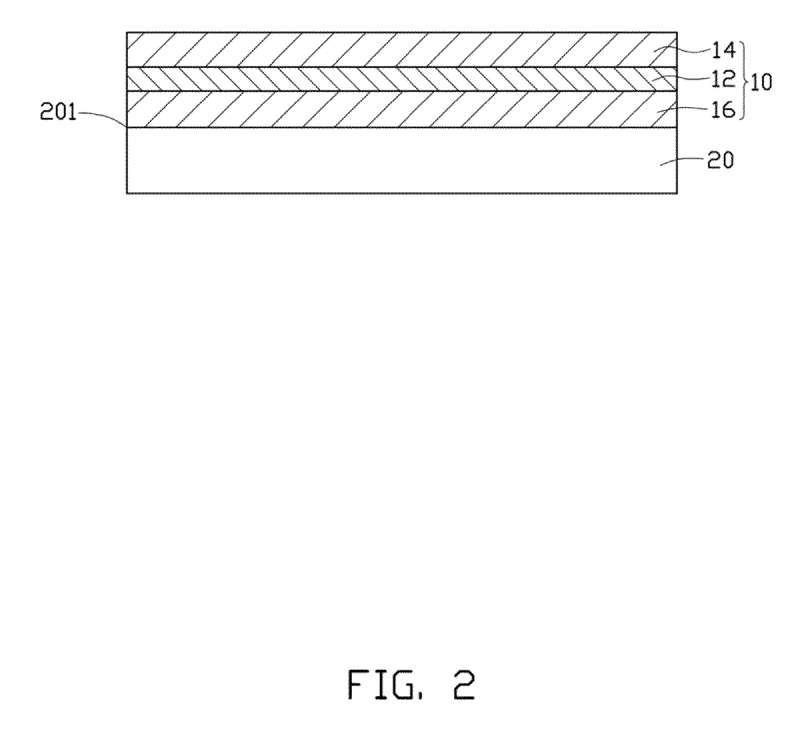
FIG. 2 is a schematic view of an electromagnetic shielding layer, in accordance with another exemplary embodiment.

Referring to FIG. 2, the electromagnetic shielding layer 10 can further include a second conductive layer 16. The second conductive layer 16 is arranged between the carbon nanotube film structure 12 and the electronic element 20, and electrically comes in contact with the carbon nanotube film structure 12 and the electronic element 20, respectively. The electromagnetic shielding layer 10 is coated on the electronic element 20 with the second conductive layer 16 attached to the surface 201. The thickness of the electromagnetic shielding layer 10 approximately ranges from 20 to 30 microns. In this embodiment, the thickness of the electromagnetic shielding layer 10 is 25 microns.

The thickness of the first conductive layer 14 and the second conductive layer 16 approximately ranges from 10 to 15 microns. The first conductive layer 14 and the second conductive layer 16 are made of metal or conductive polymer. In the embodiment, the first conductive layer 14 and the second conductive layer 16 are made of nickel.

Figure 3:
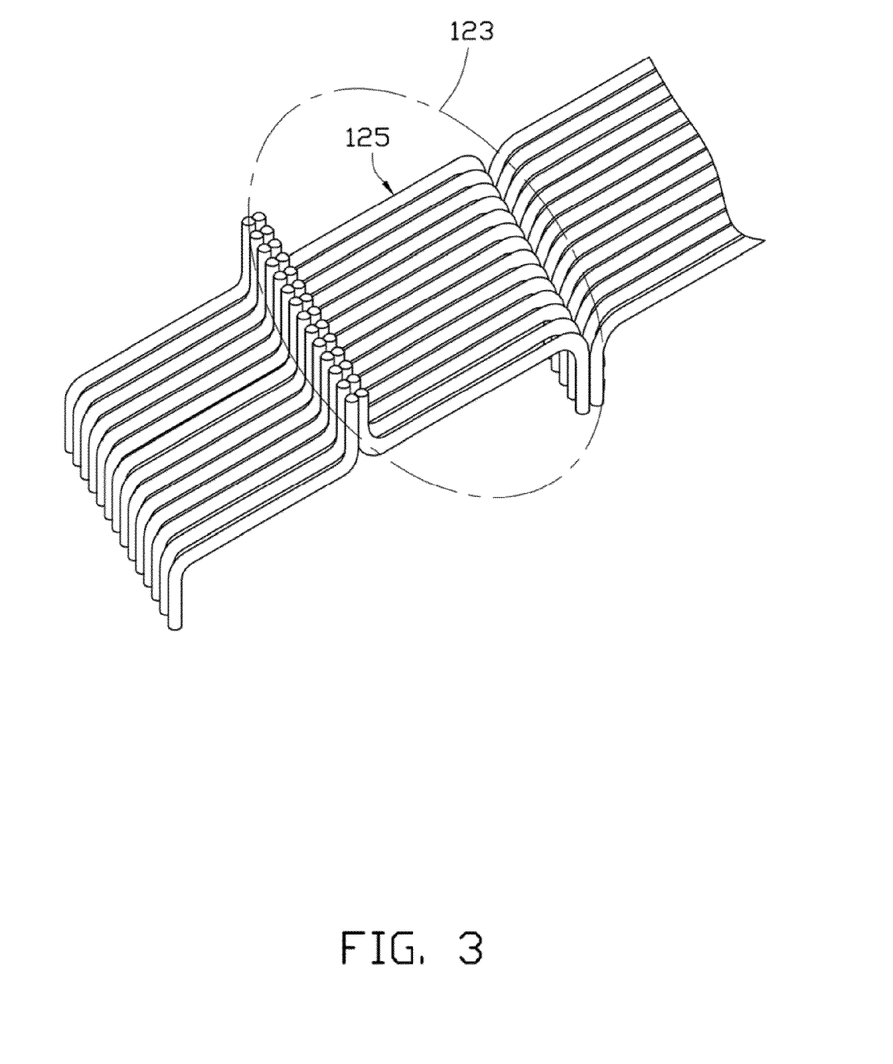
FIG. 3 is a structural schematic of a carbon nanotube film including a plurality of successively oriented carbon nanotube segments joined end-to-end by van der Waals attractive force.
Figure 4:
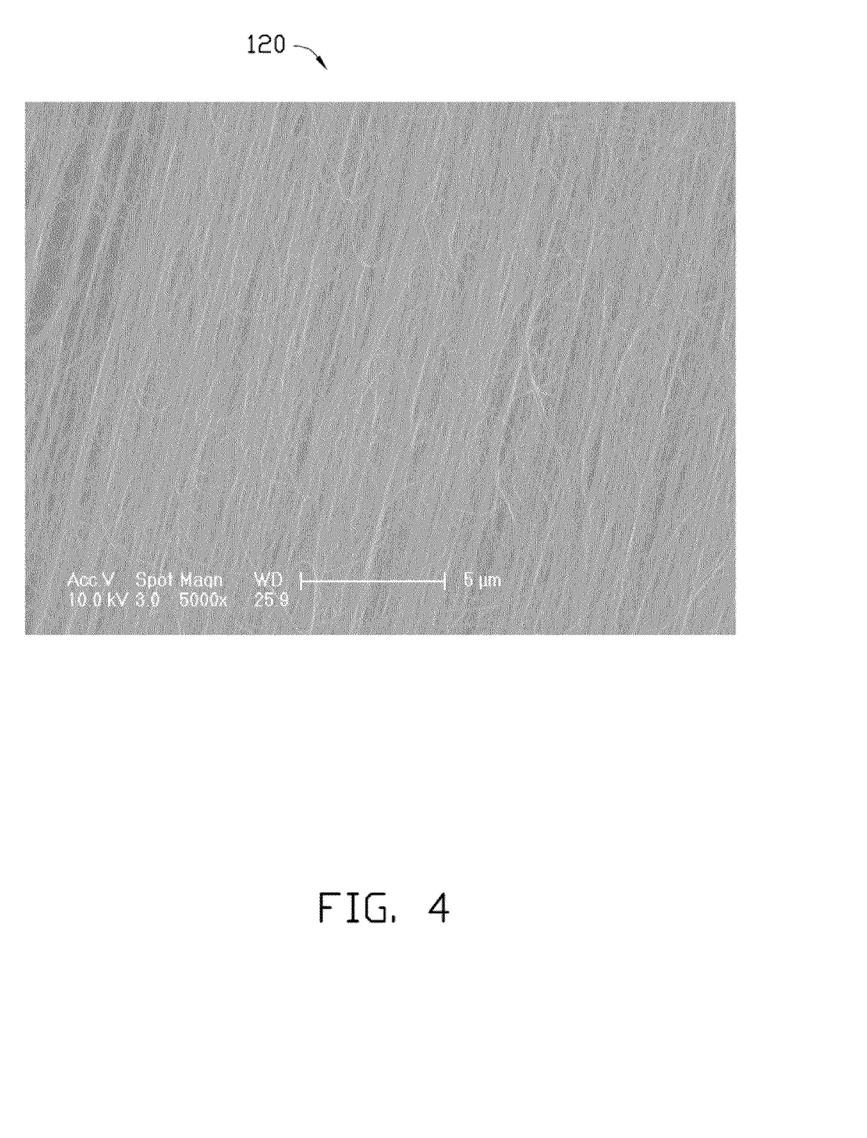
FIG. 4 shows a Scanning Electron Microscope (SEM) image of a carbon nanotube film of an electromagnetic shielding layer, in accordance with an exemplary embodiment.

Referring to FIG. 3 and FIG. 4, the carbon nanotube film structure 12 includes one carbon nanotube film 120. Each carbon nanotube film 120 includes a plurality of carbon nanotubes 125 primarily oriented a single direction. Specifically, each given carbon nanotube film 120 includes a plurality of successively oriented carbon nanotube segments 123 joined end-to-end by van der Waals attractive force. Furthermore, each carbon nanotube segment 123 has a plurality of the carbon nanotubes 125. The carbon nanotubes 125 have the substantially the same length and are parallel to each other. Adjacent carbon nanotubes 125 are secured together by van der Waals attractive force.

Figure 4A:
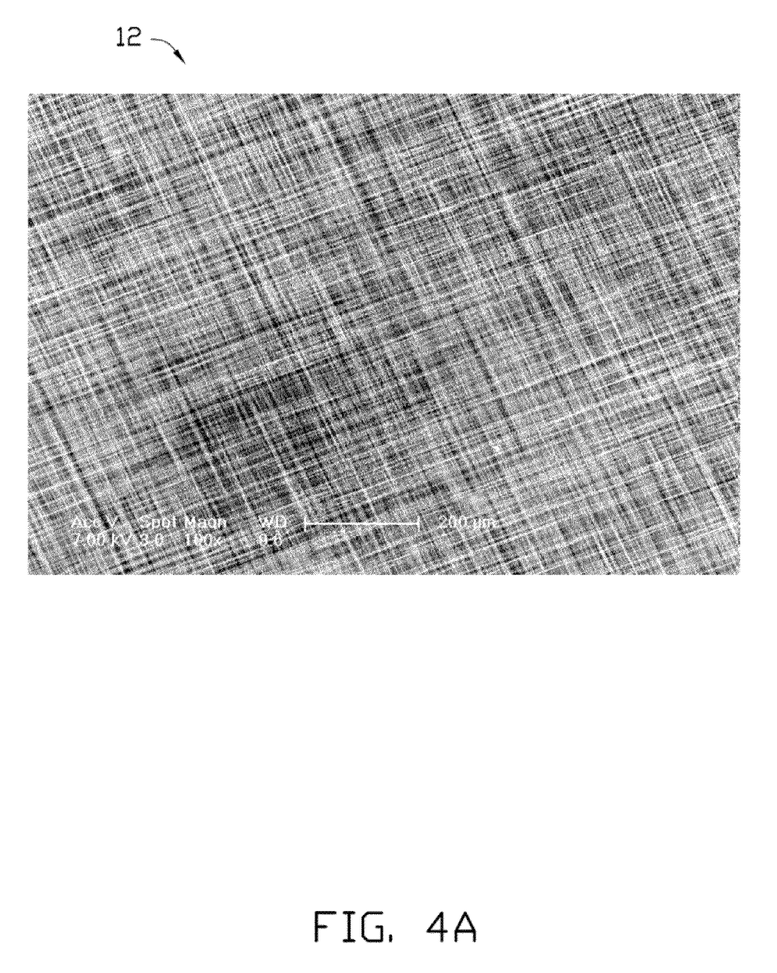
FIG. 4A shows an SEM image of one embodiment of a carbon nanotube film structure including include at least two stacked carbon nanotube films.
Figure 4B:
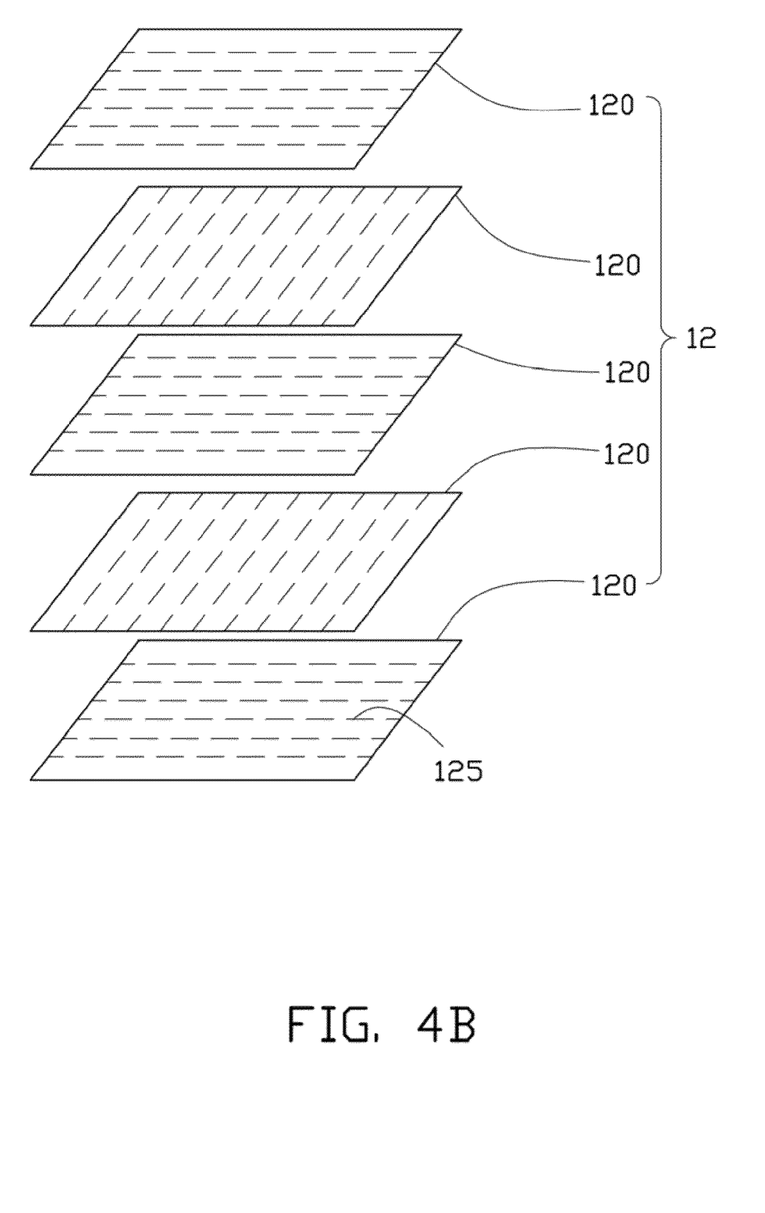
FIG. 4B is an exploded, isometric view of the carbon nanotube film structure of FIG. 4A.
Figure 4C:
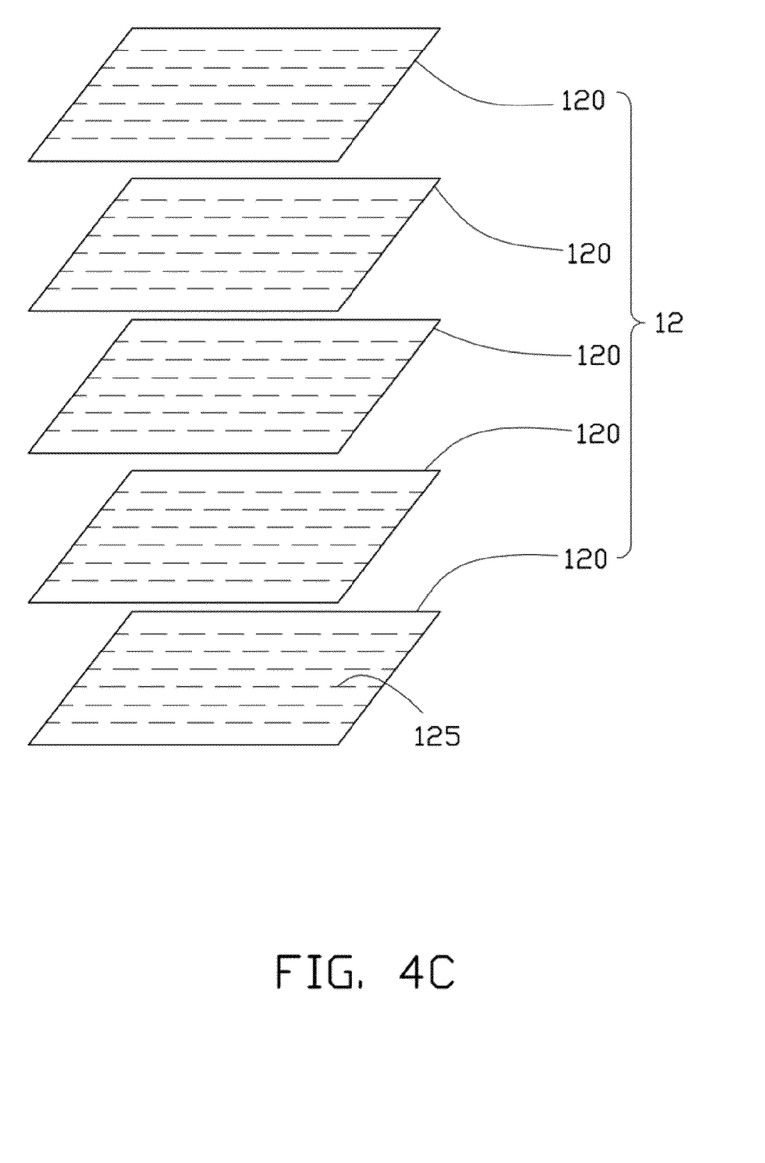
FIG. 4C is an exploded, isometric view of another embodiment a carbon nanotube film structure.

Referring from FIG. 4A to FIG. 4C, the carbon nanotube film structure 12 can also include at least two stacked carbon nanotube films 120. Each carbon nanotube film 120 includes a plurality of carbon nanotube segments 123 primarily oriented a single direction and the each segment has a plurality of carbon nanotubes 125 primarily oriented along the same direction. An angle between the primary orientation of the carbon nanotubes 125 of any two adjacent carbon nanotube films, ranges from greater than or equal to 0° to less than or equal to 90°. Referring to FIGS. 4A and 4B, the carbon nanotubes 125 in each film are primarily oriented along a single direction. An angle between primary orientation of the carbon nanotubes 125 of any two adjacent carbon nanotube films 120 is 90°.

Referring to FIG. 4C, in this embodiment, the carbon nanotube film structure 12 includes five carbon nanotube films 120. The carbon nanotubes 125 in each film are primarily oriented along a single direction. An angle between primary orientation of the carbon nanotubes 125 of any two adjacent carbon nanotube films is 0°. The thickness of the carbon nanotube film is 100 nanometers.

The carbon nanotubes 125 of the carbon nanotube film 120 can be single-wall carbon nanotubes, double-wall carbon nanotubes, multi-wall carbon nanotubes, or combinations thereof. A diameter of the carbon nanotubes 125 approximately ranges from 0.5 to 50 nanometers.

The carbon nanotube film structure 12 can be directly adhered to the surface 201 of the electronic element 20 due to its high purity and a large surface area of the carbon nanotubes. The first conductive layer 14 is disposed on the carbon nanotube film structure 12 and firmly attaches the carbon nanotube film structure 12 on the surface 201 of the electronic element 20.

Figure 5:
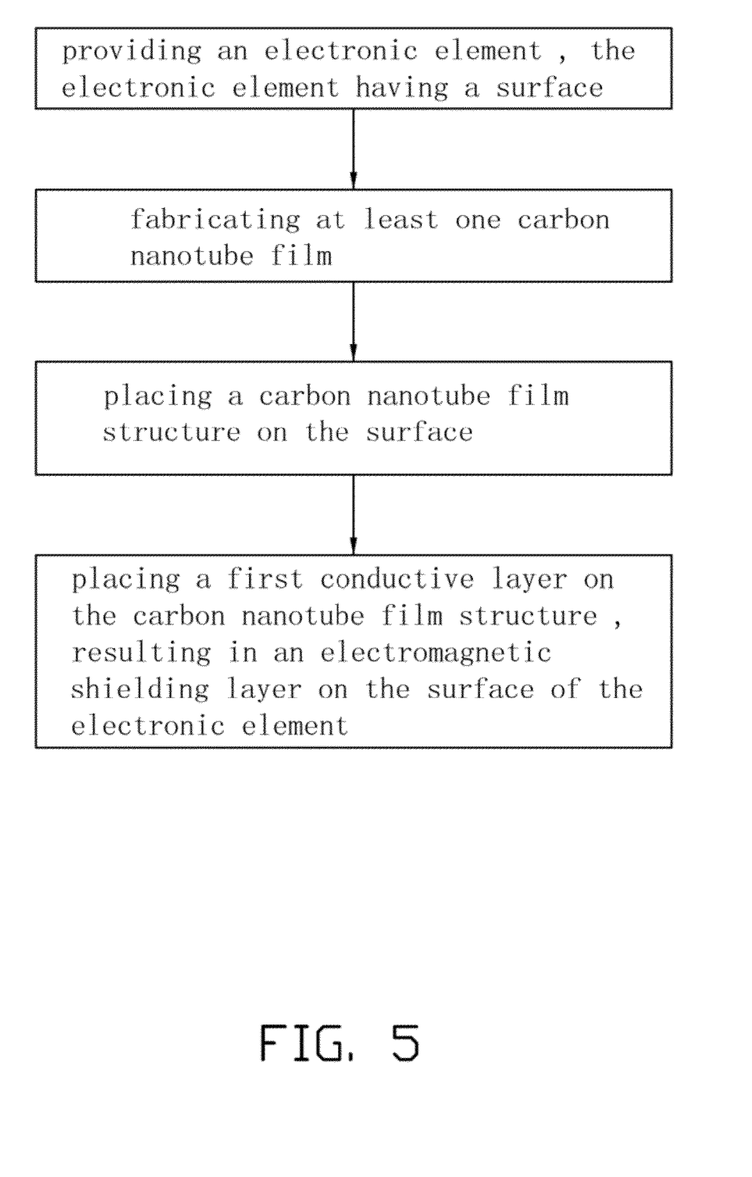
FIG. 5 is a flow chart of a method for making an electromagnetic shielding layer, in accordance with an exemplary embodiment.
Figure 5A:
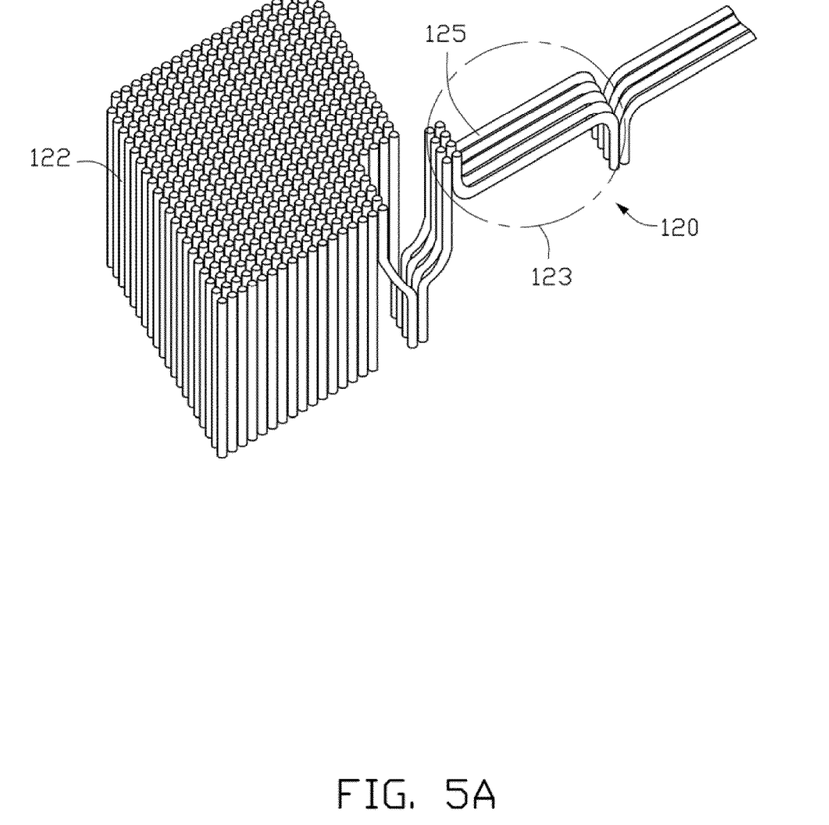
FIG. 5A is a schematic view of one embodiment of a method for making a carbon nanotube film, which is used in the method of FIG. 5.

Referring to FIG. 5 and FIG. 5A, a method for making the electromagnetic shielding layer 10 includes the steps of: (a) providing an electronic element 20, the electronic element 20 having a surface 201; (b) fabricating at least one carbon nanotube film 120; (c) placing a carbon nanotube film structure 12 on the surface 201 of the electronic element 20; and (d) placing a first conductive layer 14 on the carbon nanotube film structure 12, resulting in an electromagnetic shielding layer 10 on the surface 201 of the electronic element 20.

In step (b), the carbon nanotube film 120 can be fabricated by the substeps of: (b1) providing a substrate with a super-aligned array 122 of carbon nanotubes formed thereon; (b2) achieving a carbon nanotube film 120 from the super-aligned array 122 of carbon nanotubes by using a pulling tool (e.g., adhesive tape or another tool allowing multiple carbon nanotubes to be gripped and drawn simultaneously).

In step (b1), a given super-aligned array 122 of carbon nanotubes can be formed by the substeps of: (b11) providing a substantially flat and smooth substrate; (b12) forming a catalyst layer on the substrate; (b13) annealing the substrate with the catalyst at a temperature approximately ranging from 700° C. to 900° C. in air for about 30 to 90 minutes; (b14) heating the substrate with the catalyst at a temperature approximately ranging from 500° C. to 740° C. in a furnace with a protective gas therein; and (b15) supplying a carbon source gas into the furnace for about 5 to 30 minutes and growing a super-aligned array 122 of the carbon nanotubes from the substrate.

In step (b11), the substrate can be a P-type silicon wafer, an N-type silicon wafer, or a silicon wafer with a film of silicon dioxide thereon. A 4-inch P-type silicon wafer is used as the substrate.

In step (b12), the catalyst can be made of iron (Fe), cobalt (Co), nickel (Ni), or any alloy thereof.

In step (b14), the protective gas can be made up of at least one of the following: nitrogen ($N_2$), ammonia ($NH_3$), and a noble gas. In step (b15), the carbon source gas can be a hydrocarbon gas, such as ethylene ($C_2H_4$), methane ($CH_4$), acetylene ($C_2H_2$), ethane ($C_2H_6$), or any combination thereof.

The super-aligned array 122 of carbon nanotubes can be approximately 200 to 400 microns in height and includes a plurality of carbon nanotubes parallel to each other and substantially perpendicular to the substrate. The super-aligned array 122 of carbon nanotubes formed under the above conditions is essentially free of impurities, such as carbonaceous or residual catalyst particles. The carbon nanotubes in the super-aligned array are packed together closely by van der Waals attractive force.

In step (b2), the carbon nanotube film 120 can be drawn out from the super-aligned array 122 of carbon nanotubes by the substeps of: (b21) selecting a number of carbon nanotube segments 123 having a predetermined width and using a tool to contact therewith; and (b22) drawing the carbon nanotube segments 123 at an even/uniform speed to form the carbon nanotube film 120.

In step (b21), the carbon nanotube segments 123 having a predetermined width can be selected by using a pulling tool, such as a wide adhesive tape, to contact the super-aligned array 122 of carbon nanotubes. In step (b22), the drawing direction is substantially along a direction perpendicular to the growing direction of the super-aligned array 122 of carbon nanotubes.

More specifically, during the drawing process, as the initial carbon nanotube segments 123 are drawn out, other carbon nanotube segments 123 are also drawn out end-to-end due to the van der Waals attractive force between ends of adjacent segments. This process of drawing ensures that a successive carbon nanotube film 120 can be formed. The carbon nanotubes 125 of the carbon nanotube film are all substantially parallel to the drawing direction, and the carbon nanotube film 120 produced in such manner can be formed to have a selectable, predetermined width.

The width of the carbon nanotube film 120 depends on the size of the super-aligned array 122 of carbon nanotubes. The length of the carbon nanotube film 120 is arbitrary. In this embodiment, when the size of the substrate is 4 inches, the width of the carbon nanotube film 120 approximately ranges from 1 centimeter to 10 centimeters, and the thickness of the carbon nanotube film 120 approximately ranges from 0.01 to 100 microns.

In step (c), the carbon nanotube film structure 12 on the surface 201 of the electronic element 20 can be formed by the substeps of: (c1) providing a frame; (c2) laying at least one carbon nanotube film 120 on the frame and removing the excess film outside the frame, thereby forming a carbon nanotube film structure 12; (c3) peeling the carbon nanotube film structure 12 off the frame to achieve a self-supporting carbon nanotube film structure 12; and (c4) placing the self-supporting carbon nanotube film structure 12 on the surface 201 of the electronic element 20.

In step (c1), the frame is a square or rectangular metal frame using arbitrary metallic material (typically a chemically and mechanically durable metal/alloy). The size of the frame is dependant on the actual needs of utilization. When the width of the frame is larger than the width of the carbon nanotube film 120, a plurality of carbon nanotube films 120 can be adhered on the frame side-by-side with the carbon nanotubes being parallel to each other.

It is noted that because the carbon nanotubes in the super-aligned array 122 has a high level of purity and a high specific surface area, the carbon nanotube film structure 12 is adhesive. As such, the carbon nanotube film structure 12 can be adhered to the frame directly. The carbon nanotube film structure 12 is fixed onto the frame at an edge thereof.

In step (c), wherein the step (c) further comprises the substeps of: (c1'); laying at least one carbon nanotube film 120 on the surface 201 of the electronic element 20; (c2') removing the excess film outside the surface 201 of electronic element 20, thereby forming a carbon nanotube film structure 12 that approximately is the same shape and area as the surface 201.

After step (c), the carbon nanotube film structure 12 can be treated with an organic solvent.

The organic solvent is volatilizable and can be selected from the group consisting of ethanol, methanol, acetone, dichloroethane, chloroform, and combinations thereof. The carbon nanotube film structure 12 can be treated by the following two methods: dropping the organic solvent from a dropper to soak the entire surface of the carbon nanotube film structure 12 or immerging the frame with the carbon nanotube film structure 12 thereon into a container having an organic solvent therein. After being soaked by the organic solvent, the carbon nanotubes 125 in the carbon nanotube film structure 12 can at least partially shrink and come together into carbon nanotube strings due to the surface tension created by the organic solvent. Due to the decrease of the specific surface via bundling, the coefficient of friction of the carbon nanotube film structure 12 is reduced, while the carbon nanotube film structure 12 maintains its high mechanical strength and toughness.

In step (d), a first conductive layer 14 on a surface of the carbon nanotube film structure 12 can be formed by the following substeps: (d1) providing a conductive material which includes metal or conductive polymer; (d2) spraying or painting of the conductive material on the surface of the carbon nanotube film structure 12; and (d3) solidifying the conductive material in temperature ranging from 40° C. to 70° C., and forming the first conductive layer 14, thereby obtaining the electromagnetic shielding layer 10.

The method can further include a step of creating a second conductive layer 16 on the surface 201 of the electronic element 20.

Compared to the conventional electromagnetic shielding layer, the present electromagnetic shielding layer 10 has the following advantages: (1) the electromagnetic shielding layer 10 has a good electromagnetic shielding property due to the excellent conductivity of the carbon nanotubes; (2) the carbon nanotube film structure 12 is obtained by using a tool to draw out the array of carbon nanotubes, and the method for making the electromagnetic shielding layer 12 is relatively simple. The carbon nanotube film structure 12 can effectively resolve the electromagnetic interference existing in many devices such as mobile communication terminals, notebooks, car navigation devices and medical equipments.

It is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

It is also to be understood that while some parts of the claims may have indicia associated with them, it is by no means an indication of an order. The indicia are used for identification purposes only.

The invention claimed is:

1. An electromagnetic shielding layer comprising a first conductive layer and a carbon nanotube film structure having a first surface and a second surface parallel and opposite to each other, the first conductive layer being disposed on the first surface of the carbon nanotube film structure and having an electrical contact with the carbon nanotube film structure, wherein the carbon nanotube film structure comprises at least one carbon nanotube film, the at least one carbon nanotube film comprises a plurality of carbon nanotubes primarily oriented along a single direction, the plurality of carbon nanotubes are parallel to the first surface of the carbon nanotube film structure, wherein the second surface of the carbon nanotube film structure is located between a surface of a electronic element and the first conductive layer to shield the electronic element from electromagnetic waves, when the electromagnetic shielding layer is in operation.

2. The electromagnetic shielding layer as claimed in claim 1, wherein a thickness of the electromagnetic shielding layer approximately ranges from 20 to 30 microns.

3. The electromagnetic shielding layer as claimed in claim 1, wherein the at least one conductive layer is made of metal or conductive polymer.

4. The electromagnetic shielding layer as claimed in claim 1, wherein the carbon nanotube film structure comprises at least two stacked carbon nanotube films, wherein the at least two stacked carbon nanotube films are oriented such that an angle between primary orientations of the carbon nanotubes of any two adjacent carbon nanotube films, ranges.

5. The electromagnetic shielding layer as claimed in claim 1, wherein the at least one carbon nanotube film comprises a plurality of successively oriented carbon nanotube segments which are joined end-to-end by van der Waals attractive force therebetween.

6. The electromagnetic shielding layer as claimed in claim 5, wherein each carbon nanotube segment comprises a plurality of the carbon nanotubes, the carbon nanotubes have the substantially same length and are substantially parallel to each other, and adjacent carbon nanotubes are secured together by van der Waals attractive force therebetween.

7. The electromagnetic shielding layer as claimed in claim 1, wherein a width of the carbon nanotube film approximately ranges from 1 to 10 centimeters, and a thickness of the at least one carbon nanotube film approximately ranges from 0.01 to 100 microns.

8. The electromagnetic shielding layer as claimed in claim 1, further comprising a second conductive layer, the second conductive layer is disposed on the second surface of the carbon nanotube film structure.

9. An electromagnetic shielding layer comprising a conductive layer and a carbon nanotube film structure having a first surface and a second surface parallel and opposite to each other, the conductive layer being disposed on the first surface of the carbon nanotube film structure and having an electrical contact with the carbon nanotube film structure, wherein the carbon nanotube film structure comprises at least one carbon nanotube film, the at least one carbon nanotube film comprises a plurality of carbon nanotubes primarily oriented along a single direction, the plurality of carbon nanotubes are parallel to the first surface of the carbon nanotube film structure, wherein the second surface of the carbon nanotube film structure is attached on a surface of a electronic element to shield the electronic element from electromagnetic waves, when the electromagnetic shielding layer is in operation.

* * * * *